United States Patent
Lee et al.

(10) Patent No.: US 7,986,577 B2
(45) Date of Patent: Jul. 26, 2011

(54) PRECHARGE VOLTAGE SUPPLYING CIRCUIT

(75) Inventors: Byeong Cheol Lee, Seoul (KR); Sang Il Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 273 days.

(21) Appl. No.: 12/005,706

(22) Filed: Dec. 28, 2007

(65) Prior Publication Data

US 2008/0232182 A1    Sep. 25, 2008

(30) Foreign Application Priority Data

Mar. 19, 2007 (KR) .......... 10-2007-0026584
Jun. 27, 2007 (KR) .......... 10-2007-0063927

(51) Int. Cl.
  *G11C 7/00*    (2006.01)
  *G11C 8/00*    (2006.01)

(52) U.S. Cl. ............ 365/203; 365/189.09; 365/189.12; 365/226; 365/233.1; 365/240

(58) Field of Classification Search .......... 365/203, 365/189.05, 189.08, 189.09, 189.11, 189.12, 365/222, 226, 227, 228, 229, 233.1, 240
See application file for complete search history.

(56) References Cited

U.S. PATENT DOCUMENTS

| | | | | |
|---|---|---|---|---|
| 5,036,492 A * | 7/1991 | Runaldue | ............ | 365/203 |
| 5,469,387 A * | 11/1995 | Kim | ............ | 365/203 |
| 5,636,169 A | 6/1997 | Oh | | |
| 6,081,468 A * | 6/2000 | Taira et al. | ............ | 365/203 |
| 6,771,558 B2 * | 8/2004 | Kim | ............ | 365/203 |
| 6,842,388 B2 | 1/2005 | Origasa et al. | | |
| 6,947,346 B2 * | 9/2005 | Shore et al. | ............ | 365/222 |
| 7,057,953 B2 * | 6/2006 | Lee | ............ | 365/203 |
| 7,130,237 B2 * | 10/2006 | Kwak | ............ | 365/226 |
| 7,274,620 B2 * | 9/2007 | Jeong | ............ | 365/203 |
| 7,495,981 B2 * | 2/2009 | Park | ............ | 365/203 |
| 7,495,982 B2 * | 2/2009 | Chi | ............ | 365/203 |
| 7,499,357 B2 * | 3/2009 | Choi | ............ | 365/203 |
| 7,606,095 B2 * | 10/2009 | Hwang | ............ | 365/203 |

FOREIGN PATENT DOCUMENTS

| | | |
|---|---|---|
| KR | 10-1996-0025777 | 7/1996 |
| KR | 10-1998-0067036 | 10/1998 |
| KR | 10-1999-0004933 | 1/1999 |
| KR | 10-0172028 | 3/1999 |
| KR | 10-0586556 B1 | 5/2006 |

\* cited by examiner

*Primary Examiner* — Trong Phan

(74) *Attorney, Agent, or Firm* — John P. White; Cooper & Dunham LLP

(57) ABSTRACT

A precharge voltage supplying circuit comprises a control signal generating unit for generating a first control signal in response to a power-up signal and a clock enable signal, and a precharge voltage control unit having a bleeder circuit and driving the bleeder circuit in response to the first control signal to control a precharge voltage. The precharge voltage supplying circuit can be widely used in various devices which need the generation of a voltage, a level of which is adjustable according to a PVT characteristic change, and a range of change of which is not so large.

8 Claims, 3 Drawing Sheets ized according to a critical design rule. Thus, the memory cells can be very small and operate with a low power consumption.

PRECHARGE VOLTAGE SUPPLYING CIRCUIT

BACKGROUND

The present disclosure relates to a semiconductor memory device and, more particularly, to a precharge voltage supplying circuit.

Recently, the capacity of semiconductor memory devices is rapidly becoming larger and studies on methods to increase an operational speed and reduce current consumption are steadily conducted. Particularly, techniques to reduce the current consumption are developed in a semiconductor memory device which can be embedded in a portable system such as a cellular phone or a notebook computer.

One of the above mentioned techniques is to minimize the current consumption in a core area of a memory. The core area having a plurality of memory cells, bit lines and word lines is designed according to a critical design rule. Thus, the memory cells can be very small and operate with a low power consumption.

Particularly, a bit line precharge technique is important to increase the speed of a cell data access. The bit line precharge technique precharges a bit line (BL) to a half level of a core voltage (VCORE) before the data access in order to increase the speed of the data access.

Meanwhile, in a standby state, a potential difference occurs between a word line (WL) of 0V and a precharged bit line (BL). If a bridge occurs between the word line (WL) and the bit line (BL), a current consumption increases due to the bridge current which is caused by the potential difference. Therefore, in order to reduce the current consumption caused by the bridge current, a precharge voltage supplying circuit, which has a bleeder resistance, is used to generate a precharge voltage (VBLP) on the bit line where a voltage drop occurs.

FIG. 1 is a block diagram of a conventional precharge voltage supplying circuit.

As shown in FIG. 1, the conventional precharge voltage supplying circuit includes a precharge voltage supplying unit 100 for outputting a precharge voltage VBLP by using an internal voltage Vp in response to a clock enable signal CKE.

The precharge voltage supplying circuit outputs the precharge voltage VBLP in response to the clock enable signal CKE of a high level in a normal active state and of a low level in a power down mode.

However, in such a precharge voltage supplying circuit, the clock enable signal CKE can be either in a high level or in a low level at the time of a power-up. Thus, there is a problem that a DRAM wrongly operates since the precharge voltage VBLP is not normally supplied to the bit line and a corresponding bit bar line.

BRIEF SUMMARY

In an aspect of the present disclosure, a precharge voltage supplying circuit is provided comprising a control signal generating unit for generating a first control signal in response to a power-up signal and a clock enable signal, and a precharge voltage control unit having a bleeder circuit and driving the bleeder circuit in response to the first control signal to control a precharge voltage. The first control signal is activated when the power-up signal is applied to the control signal generating unit. The control signal generating unit outputs the first control signal, which drives the bleeder circuit, in response to the clock enable signal after a predetermined time from an input of the power-up signal.

Another aspect of the present disclosure is directed to providing a precharge voltage supplying circuit comprising a precharge voltage supplying unit for supplying a precharge voltage in response to a power-up signal and a clock enable signal, and an equalization unit for precharging a bit line and a bit bar line by using the precharge voltage.

In another embodiment of the present disclosure, a precharge voltage supplying circuit is provided, comprising a control signal generating unit for generating a first control signal which is activated at the time of a power-up, a precharge voltage control unit for controlling a precharge voltage in response to the first control signal; and an equalization unit for precharging a bit line and a bit bar line by using the precharge voltage.

DESCRIPTION OF EXEMPLARY EMBODIMENTS

Hereinafter, the present invention will be described through examples and exemplary embodiments. The examples and exemplary embodiments merely exemplify application of the present invention, and the scope of the present disclosure and the appended claims is not limited by the examples and exemplary embodiments.

Figure 1:
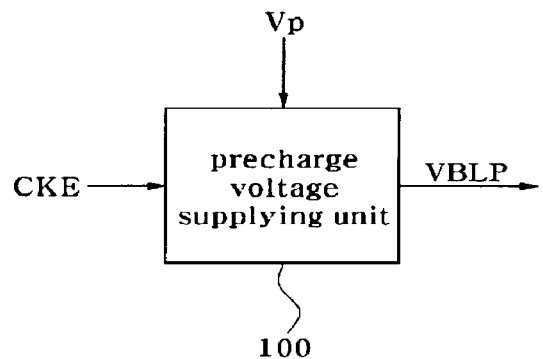
FIG. 1 is a block diagram of a conventional precharge voltage supplying circuit.
Figure 2:
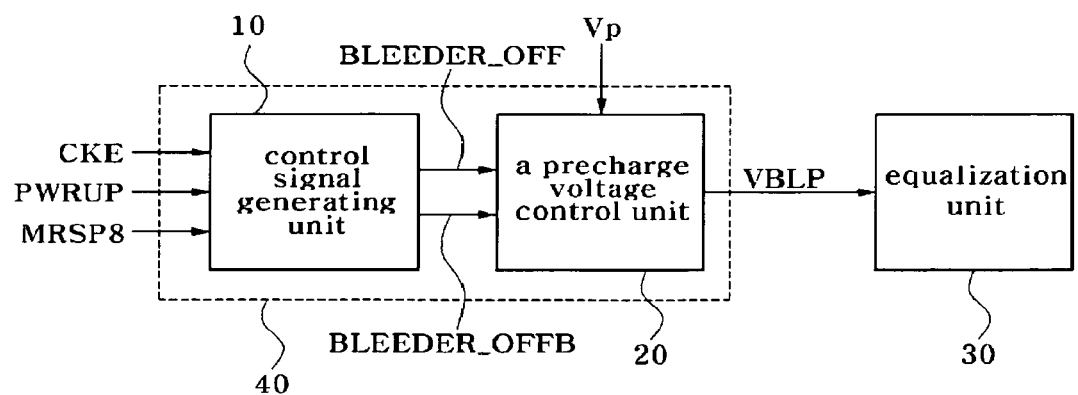
FIG. 2 is a block diagram of a precharge voltage supplying circuit according to an exemplary embodiment of the present disclosure.

As shown in FIG. 2, a precharge voltage supplying circuit according to an exemplary embodiment of the present disclosure includes a precharge voltage generating unit 40 to produce a precharge voltage VBLP by using an internal voltage Vp in response to a power-up signal PWRUP, a clock enable signal CKE and a mode register set signal MRSP8, and an equalization unit 30 for precharging a bit line and a bit bar line by using the precharge voltage VBLP.

The precharge voltage generating unit 40 can include a control signal generating unit 10 for generating control signals BLEEDER_OFF and BLEEDER_OFFB (FIG. 3) in response to the power-up signal PWRUP, the clock enable signal CKE and the mode register set signal MRSP8 (FIG. 3) and a precharge voltage control unit 20 for controlling the precharge voltage VBLP in response to the control signals BLEEDER_OFF and BLEEDER_OFFB which are activated when the power-up signal PWRUP is applied to the control signal generating unit 10.

The mode register set signal MRSP8 is activated with the lapse of about 200 μs from the input of the power-up signal PWRUP.

Figure 3:
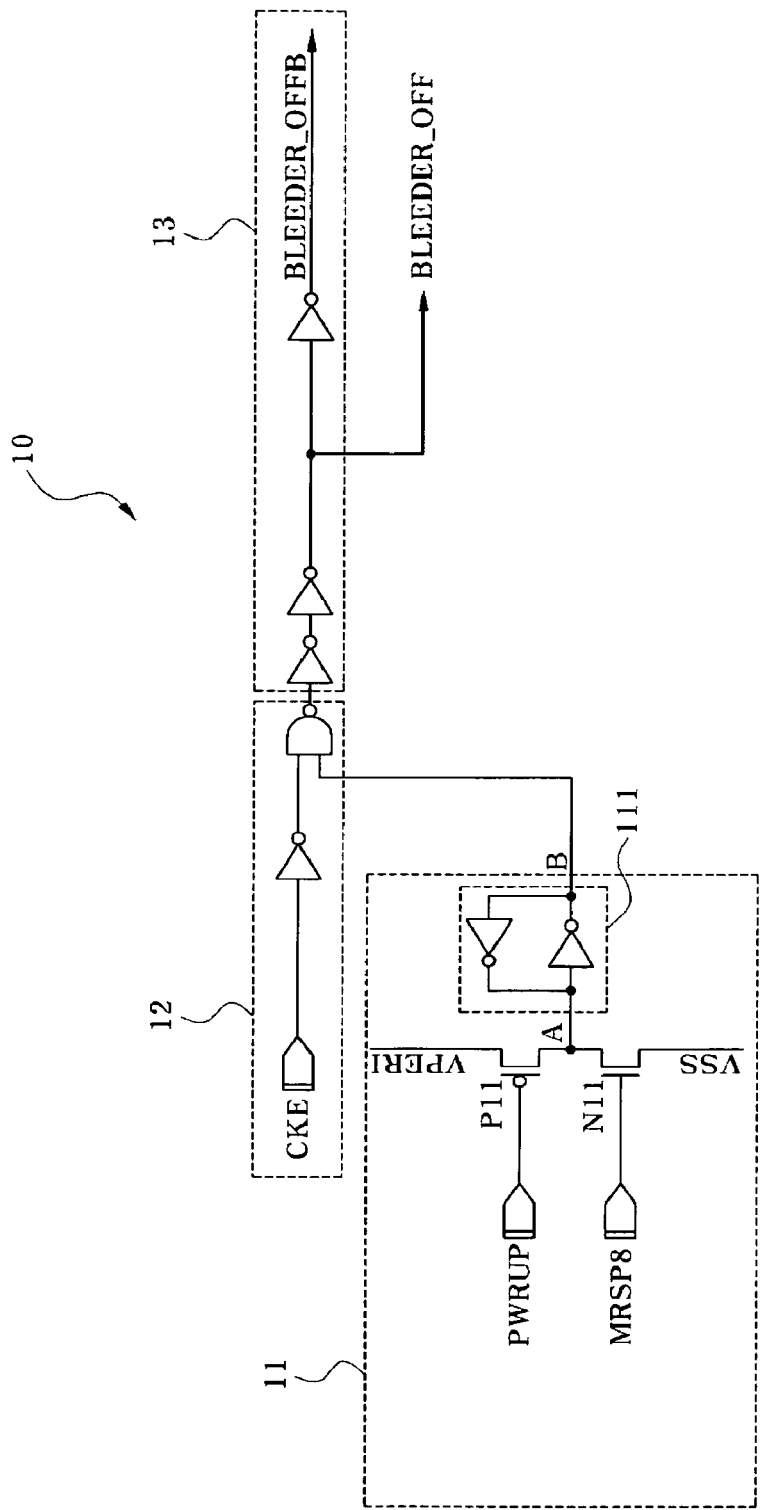
FIG. 3 is a circuit diagram of a control signal generating unit in the precharge voltage supplying circuit of FIG. 2.

As shown in FIG. 3, the control signal generating unit 10 includes a control unit 11 which is driven in response to the power-up signal PWRUP and the mode register set signal MRSP8, an operation unit 12 for performing a NAND operation of an output signal of the control unit 11 and an inverted signal of the clock enable signal CKE, and a signal generating unit 13 for outputting the control signals BLEEDER_OFF and BLEEDER_OFFB by buffering an output signal of the operation unit 12 in example of FIG. 3

The control unit 11 includes a pull-up driving unit P11 for pull-up driving node A in response to the power-up signal PWRUP, a pull-down driving unit N11 for pull-down driving node A in response to the mode register set signal MRSP8, and a latch unit 111 for latching a voltage signal at node A and for outputting the latched voltage signal to node B. The pull-up driving unit P11 is turned on for pull-up driving node A as VPERI when the power-up signal PWRUP is activated as a low level. The VPERI is an internal voltage having a high level, therefore, node A becomes a high level when the pull-up driving unit P11 is turned on. The pull-down driving unit N11 turned on for pull-down driving node A as VSS when the mode register set signal MRSP8 is activated as a high level. The VSS is a low level, and therefore, node A becomes a low level when the pull-down driving unit N11 is turned on. Here, the power-up signal PWRUP has a level transition from a low level to a high level when the power supply voltage reaches the predetermined level, and the mode register set signal MRSP8 becomes a high level after the power-up signal becomes a high level.

The first bleeder circuit 21 includes a first driver N1 which applies the internal voltage Vp as the precharge voltage VBLP to be supplied to the equalization unit 30 in response to the control signal BLEEDER_OFF, and a second driver P1 which applies the internal voltage Vp as the precharge voltage VBLP to be supplied to the equalization unit 30 in response to the inverted signal BLEEDER_OFFB of the control signal BLEEDER_OFF.

The second bleeder circuit 22 includes third to sixth drivers N2, N3, N4 and N5 which apply the internal voltage Vp to the equalization unit 30 in response to the plurality of the control signals BLEEDER_S, BLEEDER_M, BLEEDER_L and BLEEDER_XL which have different turn-on voltage levels. As described above, the drivers P1 and N1 to N5 selectively supply the internal voltage Vp to the equalization unit 30 such that the precharge voltage VBLP has different voltage levels.

An example of operation of the precharge voltage supplying circuit of FIGS. 2-4 will be described by referring to the drawings.

The control unit 11 of the control signal generating unit 10 is driven in response to the power-up signal PWRUP and the mode register set signal MRSP8, and the operation unit 12 of the control signal generating unit 10 performs a NAND operation on the output signal of the control unit 11 and the inverted signal of the clock enable signal CKE.

The signal generating unit 13 buffers the output signal of the operation unit 12 to output the control signals BLEEDER_OFF and BLEEDER_OFFB.

That is, the control signal generating unit 10 pull-up or pull-down drives node A in response to the power-up signal PWRUP and the mode register set signal MRSP8. The control signal generating unit 10 activates the control signals BLEEDER_OFF and BLEEDER_OFFB regardless of whether the clock enable signal CKE is in a high level or in a low level by maintaining node B as a low signal through the pull-up driving unit P11 when the power-up signal PWRUP is applied to the control unit 11.

Then, since the first bleeder circuit 21 maintains a turn-on state in response to the control signals BLEEDER_OFF and BLEEDER_OFFB, the internal voltage Vp is supplied as the precharge voltage VBLP to the equalization unit 30.

That is, when the power-up signal PWRUP is applied to the control signal generating unit 10, the first driver N1 and the second driver P1 of the first bleeder circuit 21 are turned on regardless of the clock enable signal CKE, and the internal voltage Vp is supplied as the precharge voltage VBLP to the equalization unit 30 for the bit line precharge.

After a predetermined time, the mode register set signal MRSP8 is activated. Then, the pull-down driving unit N11 of the control signal generating unit 10 is driven so that node B is maintained as a high signal.

At this time, the control signals BLEEDER_OFF and BLEEDER_OFFB are activated in synchronization with the clock enable signal CKE, and the first driver N1 and the second driver P1 of the first bleeder circuit 21 are turned on in synchronization with the clock enable signal CKE.

Figure 4:
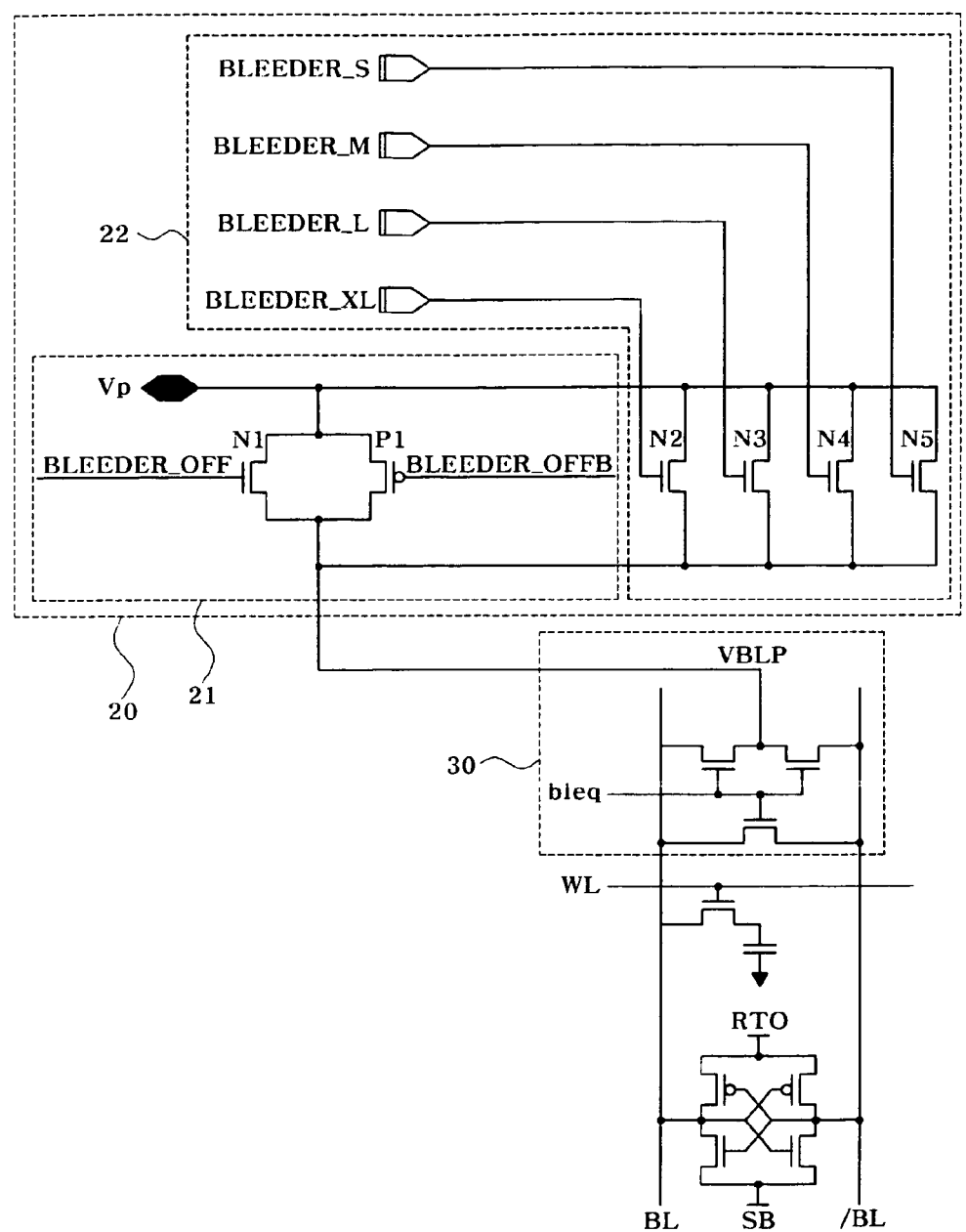
FIG. 4 is a circuit diagram of an example of a precharge voltage control unit in the precharge voltage supplying circuit of FIG. 2.

Accordingly, in the precharge voltage supplying circuit of FIGS. 2-4, when the power-up signal PWRUP is applied to the control signal generating unit 10, the control signals BLEEDER_OFF and BLEEDER_OFFB are activated regardless of the clock enable signal CKE, and the first bleeder circuit 21 of the precharge voltage control unit 20 is driven to supply the precharge voltage VBLP to the equalization unit 30.

After a predetermined time from the input of the power-up signal PWRUP, the control signals BLEEDER_OFF and BLEEDER_OFFB are activated in synchronization with the clock enable signal CKE, and the precharge voltage VBLP is supplied to the equalization unit 30.

In the present invention, the bit line and the bit bar line are precharged to a precharge voltage level by the bleeder circuit with an input of the power-up signal, and a leakage current due to a word line bridge is also reduced.

Although various examples and exemplary embodiments of a precharge voltage supplying circuit that can be used to generate a bit line precharge voltage for performing a bit line precharge operation are described in the present disclosure, it can also be widely used in various other devices which need generation of a voltage, a level of which is adjustable according to a PVT characteristic change, and a range in change of which is not so large.

Although examples and exemplary embodiments of the invention have been disclosed for illustrative purposes, those skilled in the art will appreciate that various modifications, additions and substitutions are possible, without departing from the scope and spirit of the disclosure and the accompanying claims. For example, elements and/or features of different examples and illustrative embodiments may be combined with each other and/or substituted for each other within the scope of this disclosure and appended claims.

The present disclosure claims priority to Korean applications numbers 10-2007-0026584 and 10-2007-0063927, filed on Mar. 19, 2007, and Jun. 27, 2007, respectively, the entire contents of each of which are incorporated herein by reference.

What is claimed is:

1. A precharge voltage supplying circuit, comprising:
   a control signal generating unit for generating a first control signal in response to a power-up signal, a mode register set signal, and a clock enable signal, wherein the first control signal is activated when the power-up signal is applied, and the first control signal is activated in synchronization with the clock enable signal when the mode register set signal is activated after a lapse of a predetermined time from the application of the power-up signal; and
   a precharge voltage control unit having a bleeder circuit and driving the bleeder circuit in response to the first control signal to control a precharge voltage.

2. The circuit of claim 1, wherein the first control signal is activated when the power-up signal is applied to the control signal generating unit.

3. The circuit of claim 1, wherein the control signal generating unit outputs the first control signal, which drives the bleeder circuit, in response to the clock enable signal when the power-up signal has the level transition.

4. The circuit of claim 1, wherein the control signal generating unit includes:
- a control unit driven in response to the power-up signal and the mode register set signal;
- an operation unit for performing a NAND operation on an output signal of the control unit and an inverted signal of the clock enable signal; and
- a signal generating unit for outputting the first control signal by buffering an output signal of the operation unit.

5. The circuit of claim 4, wherein the control unit includes:
- a pull-up driving unit for pull-up driving a node in response to the power-up signal;
- a pull-down driving unit for pull-down driving said node in response to the mode register set signal; and
- a latch unit for latching a signal at said node.

6. The circuit of claim 1, wherein the precharge voltage control unit includes:
- a first bleeder circuit for outputting the precharge voltage in response to the first control signal; and
- a second bleeder circuit for outputting the precharge voltage in response to a plurality of second control signals.

7. The circuit of claim 6, wherein the first bleeder circuit includes:
- a first driver for outputting the precharge voltage in response to the first control signal; and
- a second driver for outputting the precharge voltage in response to an inverted signal of the first control signal.

8. The circuit of claim 6, wherein the second bleeder circuit includes a plurality of drivers for outputting the precharge voltage in response to the plurality of second control signals wherein the drivers each have a different turn-on resistance.

* * * * *